United States Patent [19]
Ishizuka et al.

[11] Patent Number: 5,129,725
[45] Date of Patent: Jul. 14, 1992

[54] METHOD OF OPTICALLY DETECTING POSITION OF OBJECT AND POSITION DETECTING APPARATUS USING THE METHOD

[75] Inventors: Koh Ishizuka, Urawa; Tetsuharu Nishimura, Kawasaki; Masaaki Tsukiji, Tokyo; Chikara Satoh, Kawasaki; Satoshi Ishii, Tokyo, all of Japan

[73] Assignee: Canon Kabushiki Kaisha, Tokyo, Japan

[21] Appl. No.: 759,950

[22] Filed: Sep. 17, 1991

Related U.S. Application Data

[63] Continuation of Ser. No. 443,843, Dec. 4, 1989, abandoned, which is a continuation of Ser. No. 116,253, Nov. 3, 1987, abandoned.

[30] Foreign Application Priority Data

| Nov. 4, 1986 | [JP] | Japan | 61-262119 |
| Nov. 18, 1986 | [JP] | Japan | 61-276271 |
| May 27, 1987 | [JP] | Japan | 62-130699 |

[51] Int. Cl.⁵ .................................... G01B 11/14
[52] U.S. Cl. ........................... 356/374; 33/707; 250/231.14; 250/237 G
[58] Field of Search .................. 356/373, 374; 250/231 SE, 237 G, 231.14; 33/706, 707

[56] References Cited

U.S. PATENT DOCUMENTS

| 3,196,279 | 7/1965 | Papelian | 250/231 SE |
| 3,902,398 | 9/1975 | Nakada et al. | |
| 4,047,025 | 9/1977 | Lemelson | 250/237 G |
| 4,384,204 | 5/1983 | Tomaki et al. | 250/237 G |
| 4,385,234 | 5/1983 | Johnson | 250/231 SE |
| 4,439,672 | 3/1984 | Salaman | 250/231 SE |
| 4,518,859 | 5/1985 | Hashika | 250/231 SE |
| 4,616,131 | 10/1986 | Burkhardt | 250/237 G |
| 4,621,256 | 11/1986 | Rusk | 250/231 SE |
| 4,633,224 | 12/1986 | Gipp et al. | 250/231 SE |

FOREIGN PATENT DOCUMENTS

| 3145098 | 6/1982 | Fed. Rep. of Germany . |
| 3420600 | 12/1984 | Fed. Rep. of Germany . |
| 86/06895 | 11/1986 | PCT Int'l Appl. . |
| 978766 | 12/1963 | United Kingdom . |
| 1076645 | 7/1967 | United Kingdom . |
| 1257523 | 12/1971 | United Kingdom . |
| 1395265 | 5/1975 | United Kingdom . |
| 2081539 | 2/1982 | United Kingdom . |
| 2088163 | 6/1982 | United Kingdom . |
| 2114834 | 8/1983 | United Kingdom . |

Primary Examiner—Richard A. Rosenberger
Attorney, Agent, or Firm—Fitzpatrick, Cella, Harper & Scinto

[57] ABSTRACT

A method of and apparatus for optically detecting the position or amount of movement of a movable object, in which a plurality of position data element arrays are provided on a scale attached to the object such that the arrays are arranged in the direction of movement of the object. A string of light beam such as a laser beam, which extends in the same direction as the position data element array, is made to illuminate one of the arrays, and the light reflected by or transmitted through the position data element array is received by a sensor array such as CCD sensor which produces a signal representing the pattern of arrangement of the data elements in the illuminated position data element array and indicating absolute position of the object, whereby the instant absolute position of the object is detected.

11 Claims, 14 Drawing Sheets

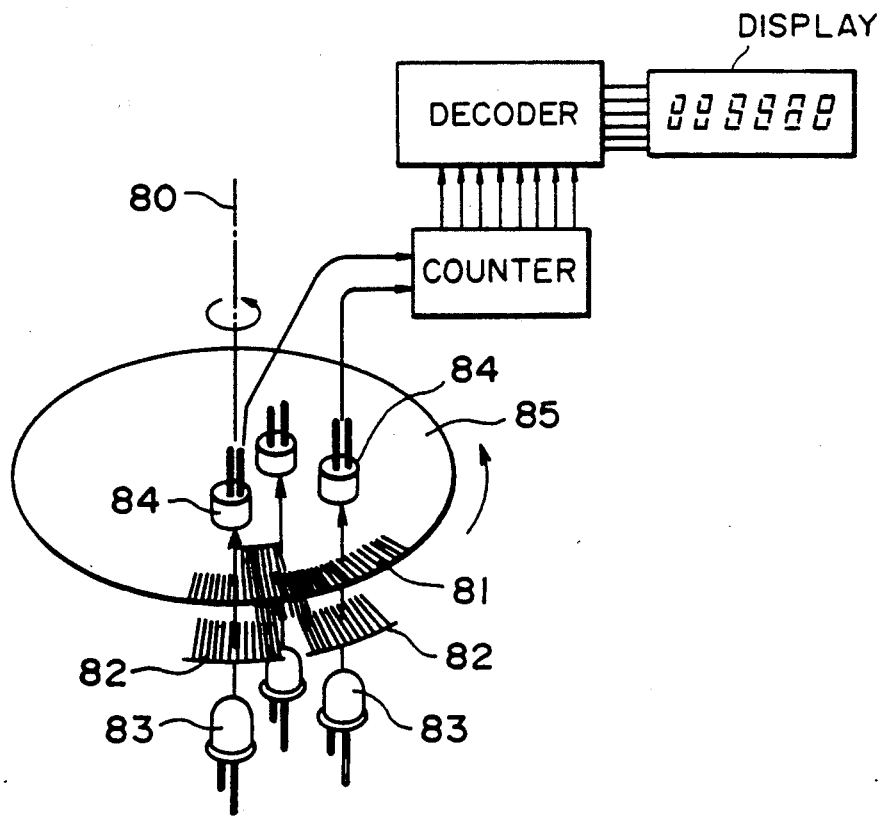
FIG. IA
PRIOR ART
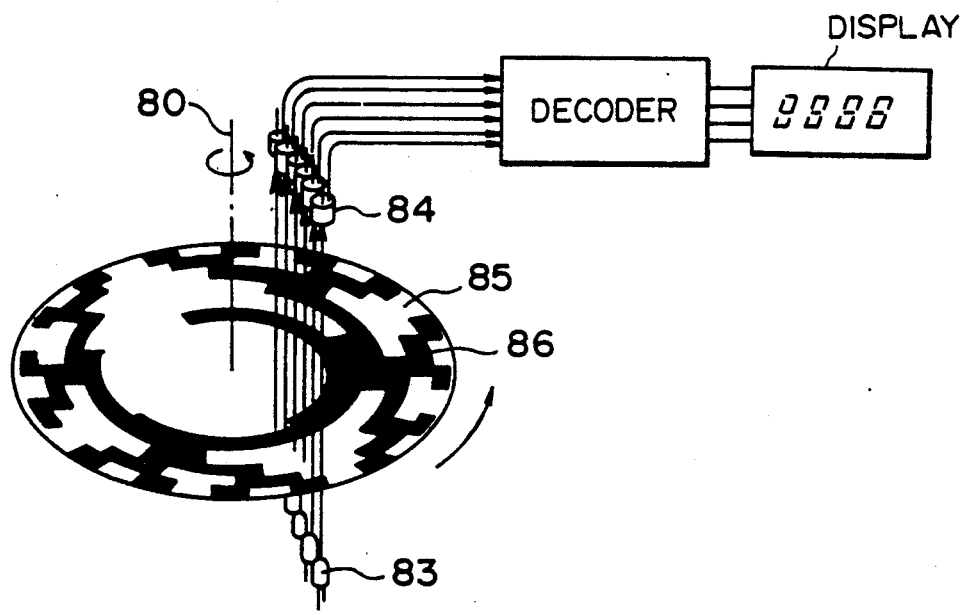
FIG. IB
PRIOR ART

FIG. 7c1 
FIG. 7c2 
FIG. 7c3 
FIG. 7c4 
FIG. 7c5 
FIG. 7c6 

METHOD OF OPTICALLY DETECTING POSITION OF OBJECT AND POSITION DETECTING APPARATUS USING THE METHOD

This application is a continuation of Ser. No. 443,843 filed Dec. 4, 1989, which is a continuation of Ser. No. 116,253 filed Nov. 3, 1987, both abandoned.

BACKGROUND OF THE INVENTION

1. Field of the Invention

The present invention relates to a method of optically detecting the position of an object and a position detecting apparatus making use of the method. More particularly, the invention is concerned with an absolute-type encoder which applies a linear string of light beam to a position information code pattern known as gray code and reproduces the position information carried by the pattern thereby detecting the position or displacement of the object.

2. Related Background

Photoelectric encoders have been widely used as displacement measuring apparatus which measures and detects displacement, moving speed and position of various types of objects, e.g., displacement of a movable part of an industrial machine, amount of rotation and rotational position of a robot arm, rotational amount and rotation speed of a rotational parts, and so forth.

FIG. 1A shows a rotary encoder which is capable of photoelectrically detecting amount and/or speed of rotation of a rotational object, as an example of the photoelectric encoders. The rotary encoder shown in FIG. 1A has a main scale 81 composed of a disk 85 fixed to a rotary shaft 80 and having translucent and non-translucent portions which are alternatingly arranged at a regular pitch. The rotary encoder also has a fixed index scale 82 having translucent and non-translucent portions arranged at the same regular interval as that in the main scale 81. The main scale 81 and the index scale 82 are disposed between a light projecting means 83 and a light receiving means 84 which are arranged to oppose each other. This arrangement is known and generally referred to as "index scale system". In operation, the main scale 81 rotates so that an output signal synchronous with the interval between the translucent and non-translucent portions of both scales is obtained. Any change in the speed of rotation of the main scale is detected by a frequency-analysis of the thus obtained signal. Obviously, a higher resolution of detection can be obtained by reducing the pitch or interval of the translucent and non-translucent portions.

This type of rotary encoder is generally referred to as "incremental-type encoder". In operation of this rotary encoder, the period of signal corresponds to the unit angle of rotation of the main scale, so that the amount of rotation can be detected by measuring the frequency of the signal. It is also possible to detect the instant rotational position of the main scale by calculating the amount of rotation from a certain reference rotational position.

Miniaturized incremental-type encoders having high degree of resolution have been already proposed by the same applicant in the specifications of the U.S. patent application Ser. Nos. 770,753; 880,207; 883,052; 002,229; 002,228 and 018.536.

The incremental-type encoder, therefore, suffer from a disadvantage in that it loses the instant rotational position of the object once the object is rotated while the encoder is in the inoperative position due to, for example, a failure in the power supply, even if the power supply is recovered after the start of rotation of the object.

There is another type of rotary encoder which is capable of detecting the absolute value of amount of rotation, known as absolute-type encoder. This rotary encoder has, as shown in FIG. 1B, a scale disk 85 connected to a rotary shaft 80. The scale disk has translucent and non-translucent portions which are arranged on concentric circles of different radii such that different gray codes 86, i.e., different patterns of combination of the translucent and non-translucent portions, are obtained for different unit angles. A light projecting means 83 and a light receiving means 84 are arranged to oppose each other across the scale disk 85. The light projecting means has an array of light source elements which are disposed to correspond to the respective concentric circles carrying the translucent and non-translucent portions. Similarly, the light receiving means has an array of light receiving elements which are disposed to correspond to the respective concentric circles carrying the translucent and non-translucent portions. The absolute angular or rotational position of the scale disk 85 can therefore be read by the light receiving means which receive a light pattern corresponding to the gray code peculiar to the angular position. Thus, the absolute-type rotary encoder always enables the instant rotational position of the scale disk 85 to be detected whenever the power supply is available at the time of detection, even if the scale disk 85 has been rotated during suspension of supply of the power. This means that the absolute-type rotary encoder can always provide correct information concerning the amount of movement or rotation, even if the supply of power has been suspended for an unexpected reason such as power failure. For this reason, the absolute-type rotary encoder is suitably employed in industrial robots and other industrial machines.

This absolute-type rotary encoder, however, encounters a problem in that the number of bits of the code, i.e., the numbers of the translucent and non-translucent portions in each code, has to be increased when a high resolution of position detection is needed. This in turn requires that the number of concentric circles of different radii, i.e., the number of tracks, is increased, so that the size of the rotational scale is increased undesirably.

In order to overcome this problem, Japanese Patent Laid-Open Publication No. 176817/1986 discloses an absolute-type rotary encoder in which position code information is recorded in the form of combinations of a plurality of pits which are formed in each track, and a laser emitter for emitting a laser beam which is divided into a plurality of fine laser means. The fine laser beams are applied to the respective pits and the state of reflection from the pits or transmission through the pits is detected so that the code information is reproduced.

This type of encoder also encounters a problem in that an impractically high degree of precision is required in adjusting an optical element such as a diffraction lattice for dividing the laser beam into fine beams, as well as a complicated tracking mechanism, in order to ensure that the fine laser beams are correctly directed to the pits on the tracks.

SUMMARY OF THE INVENTION

Accordingly, an object of the present invention is to provide a method of optically detecting the position of an object, as well as a position detecting apparatus, capable of reproducing code information representing the position of the object by a simple procedure.

Another object of the present invention is to provide a position detecting apparatus having a compact construction and capable of detecting the position of an object with a high degree of resolution.

To these ends, according to one aspect of the present invention, there is provided a method of optically detecting the position of an object comprising the steps of arranging a plurality of arrays of data elements on the object in the direction of movement of the object, each array including a plurality of pieces of data elements indicative of position information concerning the position of the object; illuminating the array of data elements with a string of a beam which extends in the same direction as the array of data elements; and reproducing the position information by detecting light from the illuminated train of data elements.

According to another aspect of the present invention, there is provided a position detecting apparatus comprising: means for emitting a light beam; illuminating, with a string of the light beam, one of data element arrays which are arranged on the object in the direction of movement of the object and each having a plurality of data elements indicative of position information concerning the position of the object; and reproducing the position information by detecting the light from the irradiated data element array.

The term "direction of movement" is used to generally include the direction of movement such as a translational movement or rotation of the object. Thus, the present invention can be embodied in the form of a linear encoder or a rotary encoder.

The data elements constitute a gray code (pattern) similar to that used in the absolute-type encoder described before Other features of the present invention will become clear from the following description of the preferred embodiments. It is to be noted, however, the described embodiments are only illustrative and are not intended to limit the scope of the invention.

BRIEF DESCRIPTION OF THE DRAWINGS

FIG 1A is a schematic illustration of a known increment-type encoder;

FIG. 1B is a schematic illustration of a known type encoder;

FIGS. 7a, 7b and 7c1–7c6 are an illustrations of the relationship between an increment signal, a reference position signal and an absolute signal derived from the encoder shown in FIG. 6;

DESCRIPTION OF THE PREFERRED EMBODIMENTS

Figure 2A:
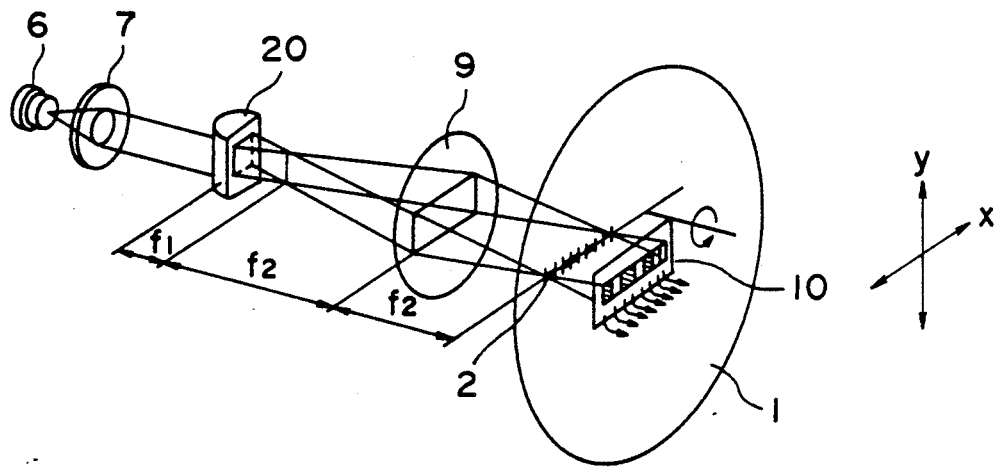
FIGS. 2A and 2B are schematic illustrations of encoders constructed in accordance with an embodiment of the present invention.
Figure 2B:
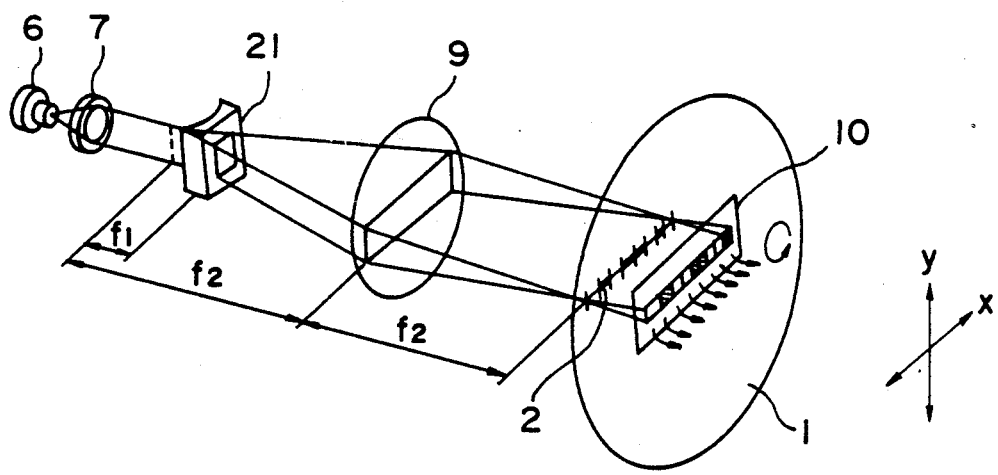

FIGS. 2A and 2B are diagrammatic illustrations of a first preferred embodiment of an absolute-position detecting apparatus utilizing the present inventive method, and each illustrates the optical system of an absolute-type rotary encoder employing a semiconductor laser as a light source.

The rotary encoders shown in FIGS. 2A and 2B partially differ from each other in regard to the form of a component used therein, but the optical arrangements of the individual components in both encoders are substantially the same as each other.

The rotary encoders illustrated in FIGS. 2A and 2B both include a semiconductor laser 6, a collimator lens 7, cylindrical lenses 20 and 21 used to constitute an anamorphic optical system, a focusing lens 9, and a unidimensional sensor array 10 such as a CCD.

These rotary encoders further include a rotating scale 1 constituted by a rotating disk, and the rotating scale 1 is attached to a rotatable object (not shown) to be measured, for example, the shaft of a motor. The rotating scale 1 has a position information code pattern 2 (hereinafter referred to as "information pattern") which is formed from the center toward the outer circumference of the rotating scale 1 (along a line parallel to the radial direction of the same). A plurality of information patterns 2 are formed over a surface of the rotating scale 1 and constitute a series of information patterns arranged in the circumferential direction of the rotating scale 1.

In the rotary encoder shown in FIG. 2A, the semiconductor laser 6 is disposed in the vicinity of a forward focus of the collimator lens 7. Diverging laser light, emitted from the semiconductor laser 6 and having a high degree of directivity, is thus collimated by the collimator lens 7.

The cylindrical lens 20, which is a flat convex-shaped cylindrical lens constituted by a convex surface and a flat surface, has a refracting power that acts only in the directions indicated by arrows x. The cylindrical lens 20 is disposed on the optical axis at a position remote from the position of the collimator lens 7 by a given distance.

The cylindrical lens 20 has a focal length $f_1$ based on the refracting power that acts in the directions of the arrows x, and the collimated laser beam obtained by the collimator lens 7 is then focused by the cylindrical lens 20 to assume a rearward focus in a linear form the longitudinal axis parallel of which lies to the directions indicated by arrows y in FIG. 2A.

The focusing lens 9, which is an ordinary spherical lens, has a focal length $f_2$. The focusing lens 9 has a forward focus and a rearward focus. The forward focus coincides with a position on which the collimated laser beam is focused by the cylindrical lens 20, that is, a position at which the collimated laser beam is shaped to assume a linear form. The rearward focus coincides with the position occupied by each of the information patterns 2 on the rotating scale 1.

Each of the information patterns 2 constitutes a position information code corresponding to a predetermined angle of rotation of the rotating scale 1.

The position information code is a binary-coded pattern representative of information indicating each position of rotation of the rotating scale 1. Each information pattern is formed by a combination of two kinds of patterns, namely, translucent and non-translucent portions corresponding to the binary-coded information. For instance, "1" of the binary-coded information may correspond to the translucent portion while "0" of the same may correspond to the non-translucent portion. In this embodiment, the information pattern is constituted by a string of slits.

These patterns of each of the information patterns 2 are located on tracks which are formed in the rotating scale 1, concentrical with respect to the direction of rotation of the rotating scale 1. Accordingly, if N represents the number of the tracks, that is, the number of patterns (bits) constituting one information pattern, the rotating scale 1 stores $2^N$-number of pieces of position information.

Referring back to FIG. 2A, the laser beam focused in a linear form by the cylindrical lens 20 is made incident upon the focusing lens 9, as a parallel beam of light with respect to the directions indicated by the illustrated arrows y and as a divergent beam of light with respect to the directions indicated by the illustrated arrows x. The focusing lens 9 converts the incident laser beam into a convergent beam of light with respect to the y directions and a parallel beam of light with respect to the x directions. The resultant light beam illuminates a predetermined one of the information patterns 2 on the rotating scale 1 in a linear form as shown in FIG. 2A.

As described previously, each of the information patterns 2 on the rotating scale 1 is constituted by a string of slits located on a plurality of tracks which are concentrically formed over the rotating scale 1. This slit string includes slits which are arranged in the radial direction of the rotating scale 1, and the presence and absence of the slits correspond to "1" and "0" of the binary-coded information.

A plurality of the aforesaid information patterns 2 are formed sequentially in the direction of rotation of the rotating scale 1, and the arrangements of the slit strings of the individual information patterns 2 differ from one another. Therefore, each of the slit strings represents information relative to a different position or angle of rotation of the rotating scale 1.

The linear light beam is made to illuminate the information pattern 2 by the focusing lens 9, and then only a predetermined portion or portions of the linear light beam are allowed to pass through the information pattern 2 in accordance with the arrangement of the slits in the illuminated slit string. The laser beam passing through the slits of the information pattern 2 is received by the unidimensional sensor array 10 which is disposed at the rear of the rotating scale 1. The unidimensional sensor array 10 provides a signal train corresponding to the arrangement of the slits in the illuminated slit string, that is, information representing the absolute position of the rotating scale 1.

In this manner, as the rotating scale 1 rotates, it is possible to obtain signals indicative of successive position of rotation of the rotating scale 1 through the unidimensional sensor array 10. The thus-obtained signals can be employed to detect an absolute position of rotation, the amount of rotation, and the rotational speed of the object. In this embodiment, the linear beam such as a laser beam having good directivity which illuminates the information patterns 2 on the rotating scale 1 has a width, in its x directions, smaller than the width of the information pattern 2, that is, the slit in its y directions. If the information pattern 2 is illuminated by the linear beam which is focused in this manner, it is possible to clearly separate each information pattern 2 from information patterns which are adjacent thereto in the direction of rotation of the rotating scale 1 and to distinctively isolate each data elements constituted by slits. It is therefore possible to form such minute information patterns 2 over a small rotating scale 1. Accordingly, even if a multiplicity of tracks are formed on the rotating scale 1 to reduce the pitch of the individual data elements constituted by slits in the direction of rotation of the rotating scale 1, it is possible to accurately reproduce the position information indicated by the information pattern.

For instance, a scale 1 having a radius as small as about 10 mm and provided with 10 tracks can easily carry $2^{10}$ pieces of position information, provided that the slit constituting a data element has a width of 20 μm as measured in the y directions and a length of 500 μm in x directions. With such a scale, therefore, a high degree of angular resolution well reaching $360°/2^{10} \approx 0.35°$ can be attained It is thus possible to simultaneously achieve both reduction in size and improvement in resolution without difficulty which has been encountered by known absolute type rotary encoders.

In this embodiment, the pitch of the sensor elements of the unidimensional sensor array 10 is approximately equal to the pitch of the tracks on the rotating scale 1 and thus the sensors correspond to the track in one-to-one relationship. In addition, in an instance where the pitch of the tracks is reduced by increasing the number of tracks on the rotating scale 1, the unidirectional sensor array 10 may become difficult to manufacture or the laser beams passed through the data elements on each track may become difficult to separate. In such an instance, an enlarged image of the information pattern 2 may be projected onto a predetermined unidimensional sensor array 10 as in the case of another preferred embodiment which will be described later.

In order to narrow the width (of the y directions) of linear beam to about several tens of micrometers to several micrometers, it is preferable that a beam of light emitted from a point source (a beam of light having good directivity) be directed to the information pattern 2. To comply with this demand, in each of the constructions shown in FIGS. 2A and 2B, the semiconductor laser 6 is employed as the light source by way of example.

It is also possible to employ a light source such as an LED which effects surface emission, instead of a semiconductor laser or a similar laser having a minute point of emission or a light source which supplies light having good directivity. In this case, however, the convergency of the light passing through the focusing lens 9 is small. For this reason, if the degree of resolution is to be enhanced by increasing the number of tracks on the rotating scale 1, there is a limitation upon an improvement in the degree of resolution. In such a case, a pin hole may be illuminated by the light emitted from the light source such as an LED and the thus-illuminated pin hole can be used as a point source to achieve an equivalent function to that of a semiconductor laser.

In this embodiment, slits are employed as data elements constituting the information patterns 2 on the rotating scale However, the forms of the data elements are not limited to minute openings such as slits. For instance, reflection patterns of a predetermined shape can be employed as data elements to reproduce position information either by detecting the presence and absence of transmitted light as in the case of this embodiment or on the basis of the presence and absence of reflected light as in the case of another embodiment which will be described later.

In the above description of the first embodiment, an absolute-type rotary encoder is referred to by way of example, but the present invention is applicable to a linear encoder. In the case of a linear encoder, a plurality of tracks may be formed in the direction parallel to the direction of movement of a moving object and data elements may be disposed on each track. Thus, the data elements on the plurality of tracks constitute position information codes or information patterns.

In addition, the method of the present invention is applicable to position detecting apparatus other than absolute-position detecting apparatus such as linear or rotary encoders. For instance, the present invention is effective in reproducing information from a recording medium, such as an optical disc or an optical card carrying such information.

The rotary encoder illustrated in FIG. 2B employs a concave cylindrical lens 21 instead of the convex cylindrical lens 20 in FIG. 2A. The cylindrical lens 21, which is constituted by a concave surface and a flat surface, has a refracting power which acts in the direction indicated by an arrow y in FIG. 2B.

As described previously, the cylindrical lens 20 converges the light beam collimated by the collimator lens 7 onto the rearward focus of the lens 9 in a linear form to convert the thus-converged light beam into a rectangular light beam. However, the cylindrical lens 21 diverges the light beam collimated by the collimator lens 7 directly in the directions of the arrows x to convert the light beam into a rectangular beam. In this case, a beam is linearly focused seemingly at a forward focus $(-f_1)$ of the cylindrical lens 21.

The method of reproducing information and the principle of detecting absolute positions which are adopted in the rotary encoder shown in FIG. 2B are not described because they are identical to those used in the rotary encoder shown in FIG. 2A.

Figure 3A:
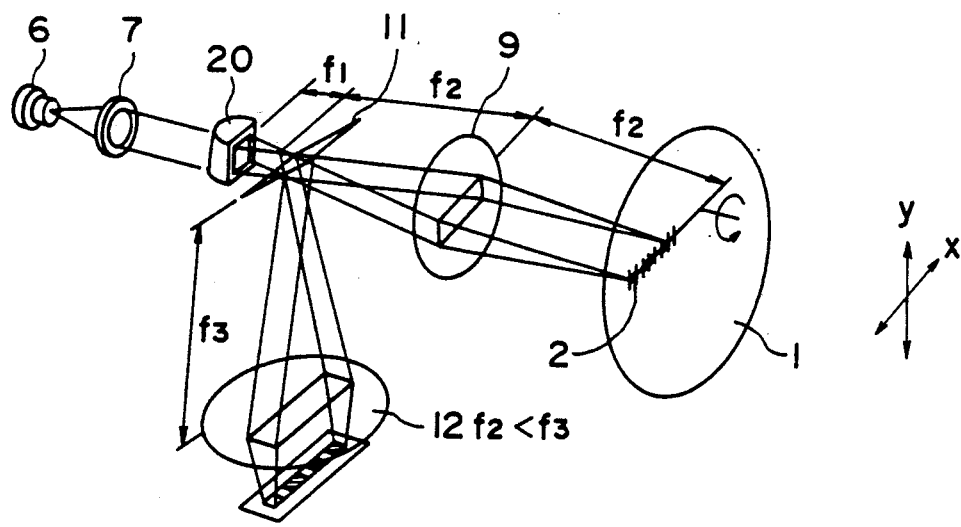
FIGS. 3A to 3C are schematic illustrations of modifications of the encoders shown in FIGS. 2A and 2B.
Figure 3B:
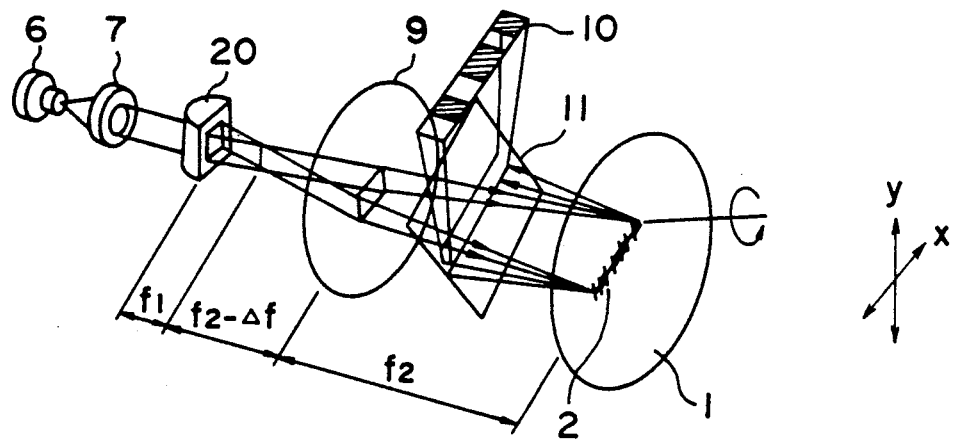
Figure 3C:
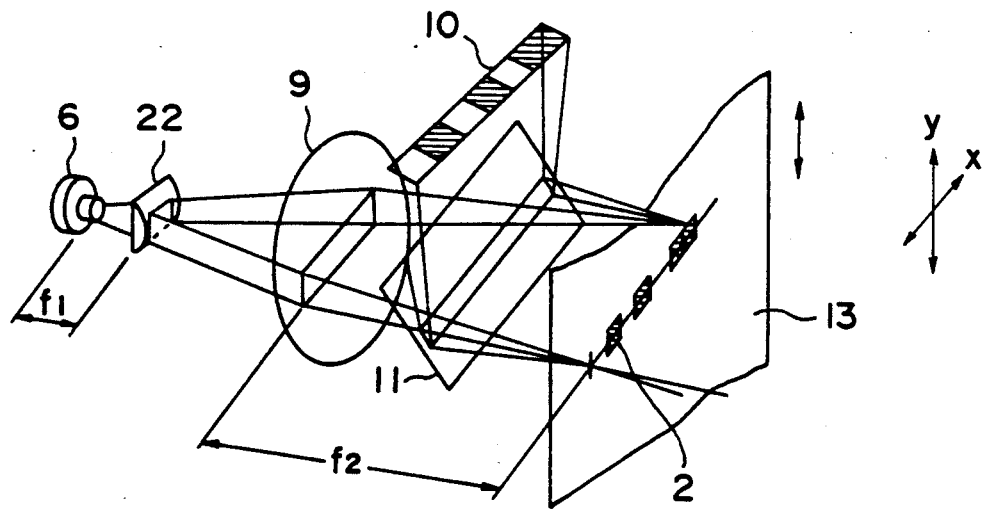

FIGS. 3A, 3B and 3C illustrate a second preferred embodiment of the absolute-position detecting apparatus employing the method of the invention, and are diagrammatic are used instead of the encoders shown in FIGS. 2A and 2B.

In FIG. 3A, like reference numerals are used to denote like or corresponding components relative to those used in the rotary encoder shown in FIG. 2A. A transparent parallel plate 11 serves as a beam splitter, and a second focusing lens is indicated at 12. A focal length $f_3$ of the second $f_2$ may be met between the focal length $f_3$ and a focal length $f_2$ of the focusing lens 9.

Each of the information patterns 2 in this second embodiment is constituted by a string of rectangular patterns provided by the aforesaid reflection film instead of the slit string used in the first embodiment shown in FIG. 2A.

In the rotary encoder shown in FIG. 3A, the parallel plate 11 is disposed in an optical path between the convex cylindrical lens 20 and the focusing lens 9. The parallel plate 11 is inclined at an angle of 45 degrees with the optical axis and the beam of light reflected from the information pattern 2 on the rotating scale 1 is directed to the second focusing lens 12 located at the bottom of FIG. 3A.

After the beam of light reflected from the information pattern 2 has further been reflected from the parallel plate 11, the beam of the thus-reflected light is focused on the unidimensional sensor array 10 by the second focusing lens 12. The parallel plate 11 is located in the vicinity of the linear focus position of the cylindrical lens 8, and is present at a position which is spaced apart from the focusing lens 9 by a distance of about $f_{2s}$, that is, near the forward focus of the focusing lens 9. The second focusing lens 12 is disposed at a position which is spaced apart from the parallel plate 11 by a distance equal to the focal length $f_3$ of the second focusing lens 12.

As described above, the relationship of $f_3 > f_2$ exists between the focal lengths $f_2$ and $f_3$ of the focusing lens 9. Therefore, a string of rectangular patterns constituting the information pattern 2 is projected on an enlarged scale onto the unidimensional sensor array 10. Accordingly, even in a case where the width of the track of the rectangular pattern strings is narrowed by further increasing the number of tracks on the rotating scale 1, it is possible to distinctively separate the light beam reflected from each of the rectangular patterns by projecting the string of rectangular patterns on an enlarged scale onto the unidimensional sensor to thereby reproduce information represented by the rectangular pattern string always at high precision. In this rotary encoder shown in FIG. 3A, the parallel plate 11 is disposed in the vicinity of the forward focus of the focusing lens 9, but the position of the parallel plate 11 is not exclusive. However, in a case where an enlargement projection system is used as in the second embodiment, the optical arrangement shown in FIG. 3A is suitable for the miniaturization of the system because this arrangement enables the size of the parallel plate 11 can be reduced and the distance between the parallel plate 11 and the second focusing lens 12 to be shortened.

The optical arrangement of the rotary encoder in the second embodiment is substantially the same as that of the rotary encoder shown in FIG. 2A, except that the second embodiment includes a detection system constituted by the parallel plate 11, the second focusing lens 12 and the unidimensional sensor array 10. Accordingly, a method of directing the laser emitted from the semiconductor laser 6 to the rotating scale 1 through the collimator lens 7, the cylindrical lens 20, the parallel plate 11, and the focusing lens 9 to cast a linearly formed laser beam upon the information pattern 2 constituted by rectangular pattern strings is similar to the method used in the rotary encoder shown in FIG. 2A. The functions and effects obtained by the rotary encoders shown in FIG. 3A are also substantially the same as those described in connection with FIG. 2A and therefore the description thereof is omitted.

The rotary encoder shown in FIG. 3B has an enlargement projection system in which the second focusing lens 12 in FIG. 3A is omitted.

In FIG. 3B, like reference numerals are used to denote like or corresponding components relative to those shown in FIG. 2A. The rotary encoder in FIG. 3B, however, has a different optical arrangement from that shown in FIG. 3A.

In this embodiment, the divergent beam of laser emitted from the semiconductor laser 6 is collimated by the collimator lens 7. The thus-collimated beam of laser is in turn incident upon the cylindrical lens 20, and is focused in a linear form at the rearward focus of the cylindrical lens 20 by the same.

In the optical arrangements shown in each of FIGS. 2A, 2B and 3A, the previously-mentioned linear focus position coincides with the forward focus of the focusing lens 9. Therefore, the laser beam which is focused in a linear form is converged in the directions indicated by the illustrated arrows y but is formed into a parallel laser beam in the directions indicated by the illustrated arrows x, and the thus-formed laser beam is directed to the information pattern 2. In this embodiment, however, the aforesaid linear focus position is not located at the forward focus of the focusing lens 9 spaced from the focusing lens 9 by the focal length $f_2$ thereof, but is located at a position spaced from the focusing lens 9 by a distance equivalent to $f_2 - \Delta f$ ($\Delta f - 0$).

Accordingly, the laser beam which is focused in a linear form by the cylindrical lens 8 is converged in the y directions and diverged in the x directions by the focusing lens 9 as viewed in FIG. 3B, and the resultant laser beam is directed to the information pattern 2.

As illustrated, the parallel plate 11, which is disposed in the optical path between the focusing lens 9 and the rotating scale 1, is inclined with respect to the optical axis. The laser beam, which is directed to the information pattern 2 by the focusing lens 9, is passed through the parallel plate 11 and is thus converged in the directions of the arrows y but diverged in the directions of the arrows x in FIG. 3B. The resultant laser beam illuminates in a linear form a string of rectangular patterns which constitute the information pattern 2 on the rotary scale 1. This linearly formed laser beam is sufficiently focused in the y directions so that the width of the linear laser beam in its y directions is not greater than the width of the rectangular pattern in its y directions.

The beam of light reflected from the information pattern 2 on the rotating scale 1 reverses toward the parallel plate 11 in the state of being diverged in the x and y directions. After reflected by the parallel plate 11, the beam is made incident upon the unidimensional sensor array 10, whereby the rectangular-pattern string on the information pattern 2 is projected on an enlarged scale onto the unidimensional sensor array 10.

Accordingly, even if the track width is narrowed by increasing the number of tracks on the rotating scale 1, it is possible to normally reproduce information with high precision by projecting the information pattern 2 onto the unidimensional sensor array 10 on an enlarged scale, as in the preceding embodiments. In addition, a reduction in size and thickness of the whole system can be achieved since the optical system can be constructed employing parts less in number than those used in the construction of FIG. 3A.

It is to be noted that, in the construction shown in FIG. 3A, the focusing lens 12 may be omitted and the laser beam reflected from the parallel plate 11 may be received directly by the unidimensional sensor array 10.

FIG. 3C shows an absolute type linear encoder which constitutes another modified form of the second embodiment. Reference numeral 13 denotes a moving object or a linear scale which is displaced in the directions of the illustrated double-headed arrow. In FIG. 3C, like reference numerals are used to denote like or corresponding components relative to those of the above-described embodiments and their modified forms.

The linear encoder illustrated as this modified form of the second embodiment is a reflection-type encoder similar to those shown in FIGS. 3A and 3B. However, the number of parts used in this modified form is further less than the number of those used in the encoder of FIG. 3B, whereby a further reduction in size and a simplified construction and hence a reduction in price can be accomplished.

In this modified form, the divergent laser beam emitted from the semiconductor laser 6 is incident directly upon the convex cylindrical lens 22. The point of emission of the semiconductor laser 6 is located at the forward focus of the cylindrical lens 22, that is, at a position which is spaced apart from the cylindrical lens 22 by a distance equivalent to the focal length $f_1$ of the lens 22, and the refracting power of the cylindrical lens 22 acts in the directions of the arrows y in FIG. 3C. Therefore, the divergent laser beam is incident upon the cylindrical lens 22 and passes therethrough in the form of a parallel laser beam with respect to the y directions but in a divergent form with respect to the x directions.

The laser beam, which passes through the cylindrical lens 22, is directed to the information pattern 2 on the moving object 13 by the focusing lens 9. As in the case of the modified form shown in FIG. 3B, the focusing lens 9 functions to converge the above-described laser beam in the y directions and to diverge it in the x directions in FIG. 3C. The beam in this state illuminates the information pattern 2.

The laser beam, which passes through the focusing lens 9, illuminates a rectangular-pattern string of the information pattern 2 through the parallel plate 11 in a linear form. The beam of light reflected from the information pattern 2 is again reflected from the parallel plate 11 and is in turn projected onto the unidimensional sensor array 10 on an enlarged scale.

In a linear encoder such as that explained in connection with FIG. 3C, a plurality of tracks are formed on the linear scale 13 in parallel with one another such as to extend in the direction of movement of the linear scale 13. Rectangular patterns serving as data elements are formed on each track, and position information is represented by each rectangular-pattern string formed in the X directions in which the tracks are arranged, that is, in the directions substantially normal to the direction of movement of the linear scale 13 (the y directions). Detection of the position information is precisely performed on the basis of a principle similar to those of the rotary encoders depicted in the above-described embodiments. Also, even if a multiplicity of tracks are disposed at a minute pitch, it is possible to detect each information pattern and each data element with a high degree of separation, whereby an encoder having a high degree of resolution can be provided.

The encoders described in connection with FIGS. 3A, 3B and 3C employ parallel plates 11 because these encoders adopt reflection type optical arrangements. The use of the parallel plate 11, which is an inexpensive optical part, is preferred provided that the semiconductor laser 6 produces a sufficiently high level of output and that the sensor elements of the unidimensional sensor array have high level of sensitivity. However, when the power of the laser source is comparatively low, or when the sensitivity of the sensor elements is not so high, the described rotary encoders can employ in place of the parallel plate an optical path dividing system composed a quarter-wave plate and a polarization beam splitter. It is also possible to substitute a half mirror or an equivalent element for the parallel plate 11.

In order to obtain a high stability of precision of detection, it is advisable that the pitch of the elements on the unidimensional sensor array 1 and the track pitch of tracks on the rotating scale 1 or the linear scale 13 are so determined in relation to each other that these pitches are equal to each other or a multiple or a sub-multiple of each other.

The unidimensional sensor array may be composed of an array of photodiodes or an array of imaging elements of charge transfer type such as CCD. The type of the unidimensional sensor array can suitably be selected in accordance with the specification of the encoder.

In the described embodiment, the position code information and other information to be reproduced usually have unidimensional array of data elements. The sensor array for reproducing such information, however, need not always be unidimensional. Namely, it is possible to use, for example, two-dimensional sensor array.

Figure 4:
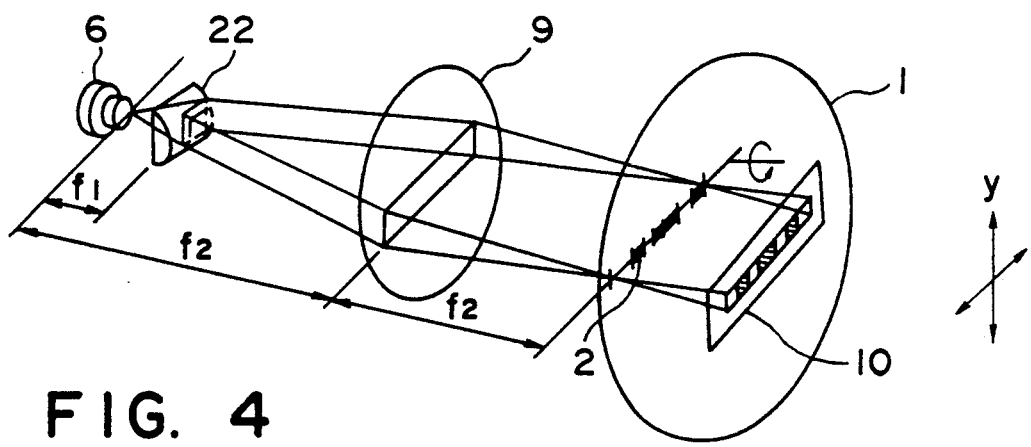
FIGS. 4, 5A and 5B are schematic illustrations of further modifications of the embodiment shown in FIGS. 2A and 2B.

FIG. 4 schematically shows the optical system incorporated in a modification of the encoder as shown in FIG. 3C. This modification is, as in the case of encoders shown in FIGS. 2A and 2B, a light-transmitting type encoder. In FIG. 4, the same reference numerals are used to denote the same parts or members as those appearing in FIG. 3C. A cylindrical lens 22 shown in FIG. 4 has a refractive power only in y directions as in the case of the cylindrical lens 20 in the system shown in FIG. 3C.

A divergent light ray from the semiconductor laser 6 is collimated only in the y directions by the cylindrical lens 22 which is located at a position spaced from the emitting point by a distance equal to the focal length $f_1$ thereof. The focusing lens 9 is located at a position which is spaced from the emitting point of the semiconductor laser 6 by a distance equal to the focal length $f_2$ thereof. The beam from the cylindrical lens 22 is converged in the y directions and collimated in the x directions by the action of the focusing lens 9. The thus collimated laser beam is directed towards the information pattern 2. In consequence, the information pattern is illuminated by the string of beam coming from the focusing lens 9. It is to be noted that the width of the beam string as measured in the y directions is smaller than the width of the data element as measured in the y directions. The data element may be a slit similar to that explained in connection with FIGS. 2A and 2B.

The beam which has passed through the information pattern 2 impinges upon the unidimensional sensor array 10 while converging in the y directions, so that the array of data elements constituting the information pattern is projected on the unidimensional array 10, whereby the information is reproduced.

Figure 5A:
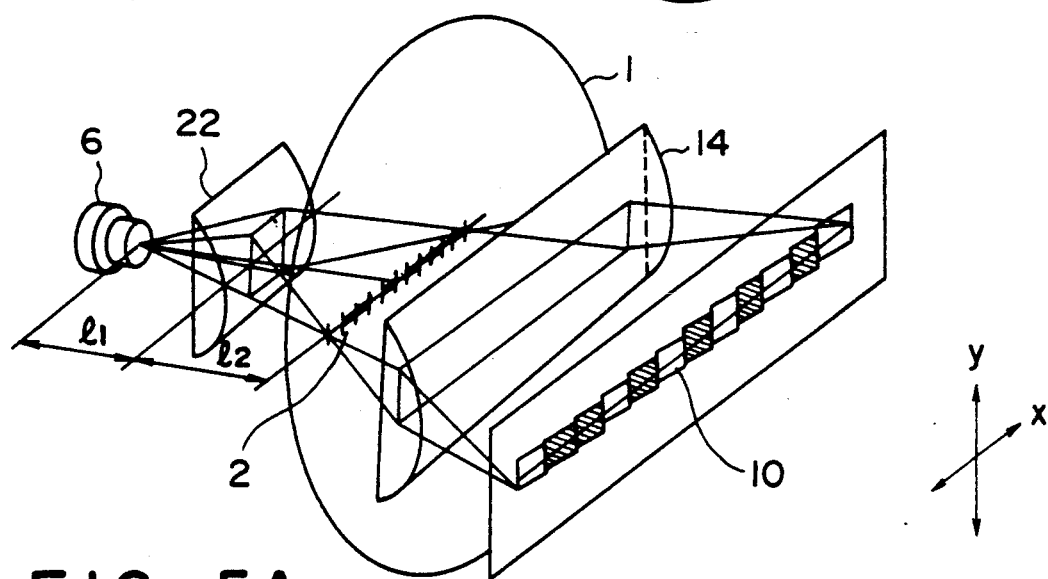
Figure 5B:
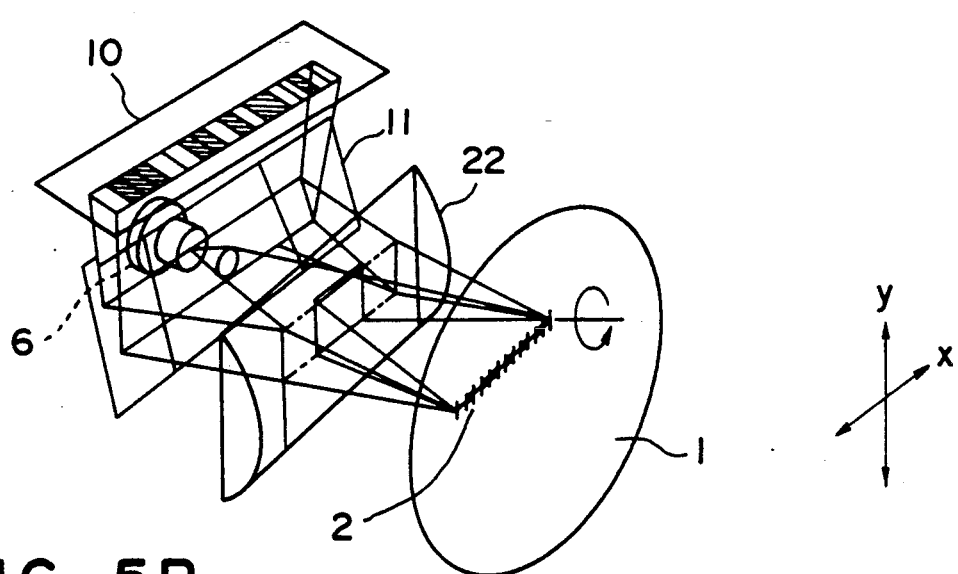

FIGS. 5A and 5b show optical systems of modifications of the rotary encoders shown in FIGS. 3A and 3B. These modifications are encoders of light-transmission type and reflection type, respectively, having compact constructions with reduced numbers of parts.

Each of the optical systems has a second cylindrical lens 14 having refractive power in the directions of arrow y. Other components of the optical systems are the same as those in the systems shown in FIGS. 3A and 3B and are denoted by the same reference numerals. The direction of refractive power of the cylindrical lens 22 in each of the systems shown in FIGS. 5A and 5B is orthogonal to the direction of the refractive power of the cylindrical lenses 20 and 21 in the arrangements shown in FIGS. 2A, 2B and FIGS. 3A, 3B, as in the case of the cylindrical lens shown in FIGS. 3C and 4.

It will be understood that the optical systems shown in FIGS. 5A and 5B do not employ any collimator lens and focusing lens, and the refraction system is composed only of cylindrical lenses.

Referring to FIG. 5A, diverging laser beam emitted from the semiconductor laser 6 impinges upon the cylindrical lens 22 which is located on the optical axis at a position spaced by the emitting point of the semiconductor laser 6 by a distance $l_1$. The position where the cylindrical lens 22 is located is spaced from the information pattern 2 on the rotating scale 1 by a distance $l_2$. The diverging beam coming into the cylindrical lens 22 is converged only in the y directions but is not refracted at all in the x directions. The beam from the cylindrical lens 22 is directed towards the information pattern 2. In consequence, the information pattern is illuminated with a beam which diverges only in the y directions.

Representing the focal length of the cylindrical lens 22 by f, the following relationship exists at the so-called meridional section.

$$1/l_1 + 1/l_2 = 1/f$$

Thus, the emitting point on the semiconductor laser 6 and the information pattern 2 are in conjugate relation to each other in the y directions.

The beam which has passed through the information pattern 2 constituted by, for example, an array of slits, runs towards the unidimensional sensor array 10 while diverging both in x and y directions, so that the information pattern 2 on the rotating scale 1 is projected on a greater scale on the unidimensional sensor array 10. In the encoder under description, however, the convergence of the beam in the y directions is compensated for by the second cylindrical lens 14 which is interposed between the rotating scale 1 and the unidimensional sensor array 10.

The second cylindrical lens, which effectively converges the beam coming from the information pattern 2 and tending to diverge in the y directions, enables an efficient application of the beam onto the sensor, thus contributing to a reduction in the size of the sensor. It is to be understood that the information pattern 2 and the unidimensional sensor array 10 are in conjugate relation to each other in the y directions with respect to the cylindrical lens 14. This conjugate relationship, however, is not essential.

This modification may be further modified such that the second cylindrical lens, 14 is omitted with the unidimensional sensor array 10 located in the close proximity of the rotating scale 1.

Referring now to FIG. 5B, the diverging beam from the semiconductor laser 6 impinges upon the parallel plate 11 which is disposed at an inclination on the optical axis. The diverging beam passes through the parallel plate 11 in a diverging manner and impinges upon the cylindrical lens 22.

The cylindrical lens 22 acts to converge the beam only in the directions of arrow y so that the information pattern 2 carried by the rotating scale 1 is illuminated by a string of the beam. The width of the beam string in y directions is smaller than the width of the reflective rectangular pattern array constituting the information pattern 2 as measured in the same direction y.

The beam reflected by the rectangular pattern array of the information pattern 2 impinges upon the cylindrical lens 22. The beam entering the cylindrical lens 22 has a tendency for divergence in y directions but this tendency is changed into converging tendency to converge in the y directions by the cylindrical lens 22. The thus converging beam is then reflected by the parallel plate 11. The beam, however, still hold the tendency of diverging in the x directions.

In consequence, the beam reflected by the parallel plate 11 impinges upon the unidimensional sensor array 10, whereby the image of the information pattern 2 is projected in a greater scale on the unidimensional sensor array 10.

Thus, the cylindrical lens 22 in the optical system shown in FIG. 5B plays a double role: namely, the role of the cylindrical lens 22 in the optical system shown in FIG. 5A and the second cylindrical lens 14 of the same. It is thus possible to obtain a reflection-type encoder having high degrees of detecting precision and resolution, with four principal elements: namely, the semiconductor laser 6, the parallel plate 11, the cylindrical lens 22 and the unidimensional sensor array 10.

The light-transmitting type encoders shown in FIGS. 4 and 5a also contributes to reduction in the size and cost of the position detecting apparatus, thanks to the reduced number of parts employed.

As will be understood from the foregoing description, the optical method of the invention for reproducing position information, one of a plurality of arrays of data elements arranged in a predetermined direction and representing predetermined position information is illuminated by a beam string having a width smaller than that of the data element as measured in the direction orthogonal to the array, whereby the information is reproduced from the array of data element always with a high degree of precision.

Various different pieces of information are carried by different arrays of similar data elements, the arrays being arranged in the direction substantially orthogonal to the direction in which the array extends. According to the invention, it is possible to effect a distinctive separation between the pieces of information carried by the adjacent arrays of data elements. This in turn makes it possible to reduce the size of the data elements and to reduce the pitch of the arrangement of arrays of data elements, without impairing the resolution.

The absolute position detecting apparatus making use of the method described above is advantageous in that the number of tracks carrying data elements can be remarkably increased because the arrays of the data elements representing the position information can be arranged with a sufficiently small pitch on a rotatable or movable object, whereby the position detection can be accomplished with a high degree of resolution.

Furthermore, the size of the apparatus is reduced and the construction can be simplified, so that a compact absolute-type encoder having high degree of resolution is obtained.

In some embodiments of the invention, the array of the data elements representing position information can be projected onto a sensor so that each data elements can be isolated with a high degree of distinction. This in turn enables the size of the data element to be reduced and makes it possible to form a greater number of tracks on a given area of the object.

In the present invention, a string of beam is formed by finely converging a beam from a light source means having a minute light-emitting point or a light-source means capable of emitting a light beam having a high directivity. In particular, a semiconductor laser can suitably be used as an inexpensive and compact light source means in the apparatus of the present invention.

Figure 6:
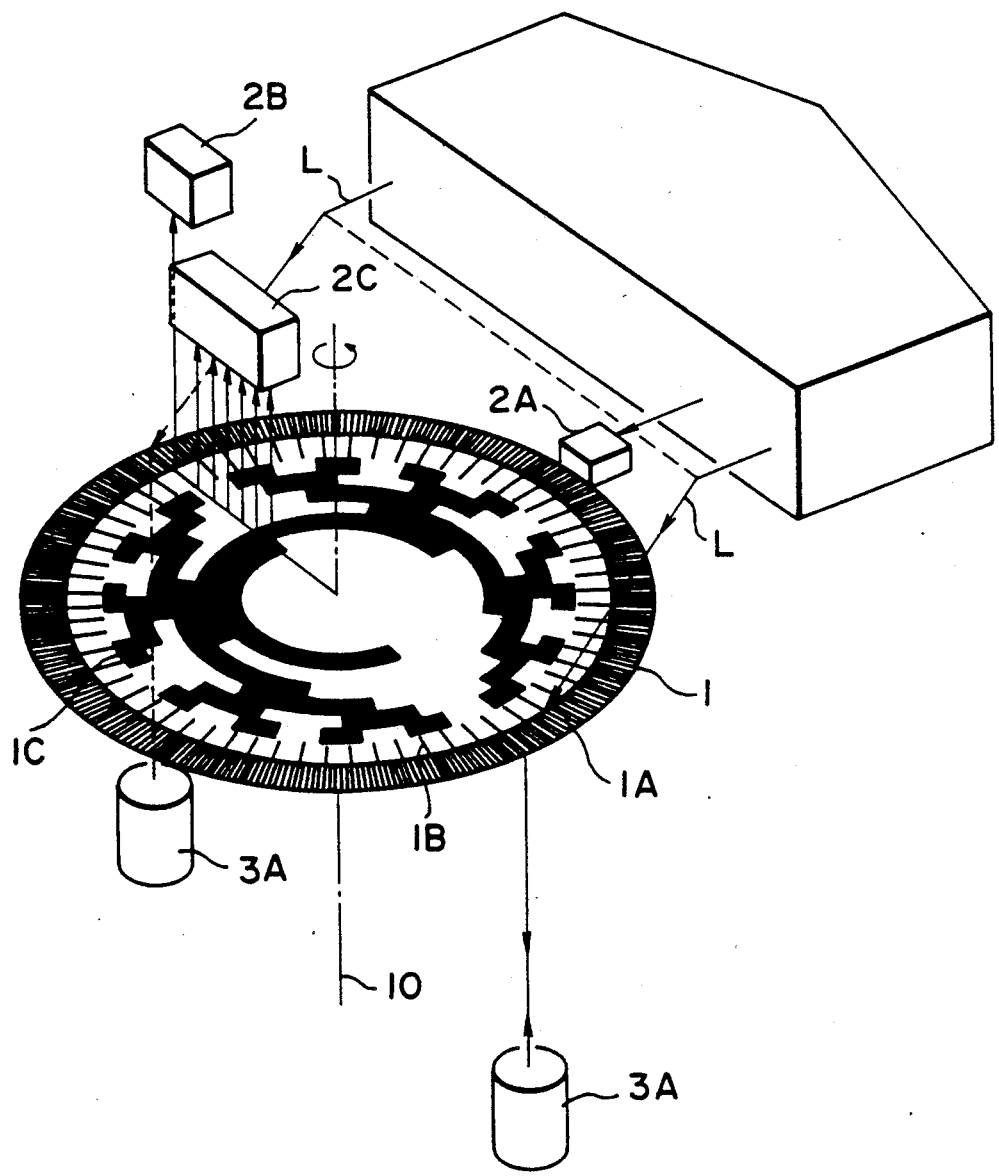
FIG. 6 is a schematic illustration of an encoder constructed in accordance with another embodiment of the present invention.

FIG. 6 is a schematic illustration of an optical system in a different embodiment of the present invention constructed as a rotary encoder. Referring to this Figure, a rotating scale 1 made of a chart plate is fixed to a measuring object (not shown) which is rotatable The optical system has a grid portion 1A adapted for generating an incremental signal. The grid portion 1A has a number of grids arranged on the outer peripheral portion of the rotating scale 1 radially around the axis 10 of rotation at a regular pitch. The pitch 4 is much smaller than the width of the gray code of a code portion which will be mentioned later. A reading device 2A is adapted for receiving incremental signals through the grid portion 1A.

The optical system further has a reference position grid portion 1B which is intended for producing a reference position signal as desired. The reference position grid portion 1B is disposed inside of the grid portion 1A. Another reading device 2B is adapted for receiving the reference position signal through the reference posit grid portion 1B. The aforementioned code portion, represented by 1C, is provided for the purpose of producing an absolute signal. The code portion is constituted by binary gray code constituted by translucent portions and non-translucent portions as in the preceding embodiments. The code portion 1C is disposed adjacent to and within the reference position grid portion 1B. Still another reading device 2C receives the absolute signal through the code portion 1C. A symbol L represents a light beam. The light beam L impinging upon and diffracted by the grid portion 1A of the chart plate 1 is reflected by the reflection means 3A so as to impinge upon the initial position.

Although not shown, light sources are disposed to oppose the respective reading devices 2B and 2C across the rotating scale 1.

In this embodiment of the position detecting apparatus, a light beam is applied to the grid portion and the code portion of the rotating scale, and the portion of the light directly transmitted through the scale 1 and the portion of the light diffracted by the same are received by the respective reading devices 2A, 2B and 2C which produce respective output signals.

More specifically, the light beam L from the light source impinges upon the grid portion 1A of the rotating scale 1 and two diffracted components of the beam diffracted by the grid portion 1A are made to interfere with each other so as to form interference fringes. A signal indicative of the state of movement of the object can be obtained by counting the bright and dark fringes of the interference fringes. The principle of the encoder which makes use of the interference fringes formed by diffracted light components is described in the aforementioned specifications of the U.S. patent application Ser. No. 770,753; 880,207; 883,052 and 002,229, so that description thereof is omitted in this specification.

Figure 7A:
Figure 7B:

FIG. 7 is a diagram illustrating the signals derived from the reading devices 2A, 2B and 2C. More specifically, this figure shows an incremental signal a derived from the reading device 2A, a reference position signal b derived from the reading device 2B and absolute signals C1 to C6 which are derived from the reading device 2C.

In this embodiment, degrees of precision of the components have been determined such that the accuracy of the reference position signal is equal to or higher than that of the incremental signal. In this embodiment, the reference position signal is utilized such that the absolute position of the rotating scale 1 is detected at the moment at which the reference position signal is generated, so as to eliminate any degradation of the detection precision which may otherwise be caused by presence of vagueness in the transient period between successive absolute signals.

Thus, in this embodiment, the absolute signal and the incremental signal are detected simultaneously, so that the absolute position is detected with high accuracy by virtue of the absolute signal, while the period intermediate between the successive absolute signals is interpolated by the incremental signal. Consequently, the encoder of this embodiment can detect the position of an object with a high degree of resolution.

The reference position grid portion 1B for producing the reference position signal is not essential. When the reference position grid portion 1B is omitted, the precision of detection may be impaired slightly. This, however, does not cause any problem provided that the incremental signal is read in the transient period between the successive absolute position signals.

Figure 8A:
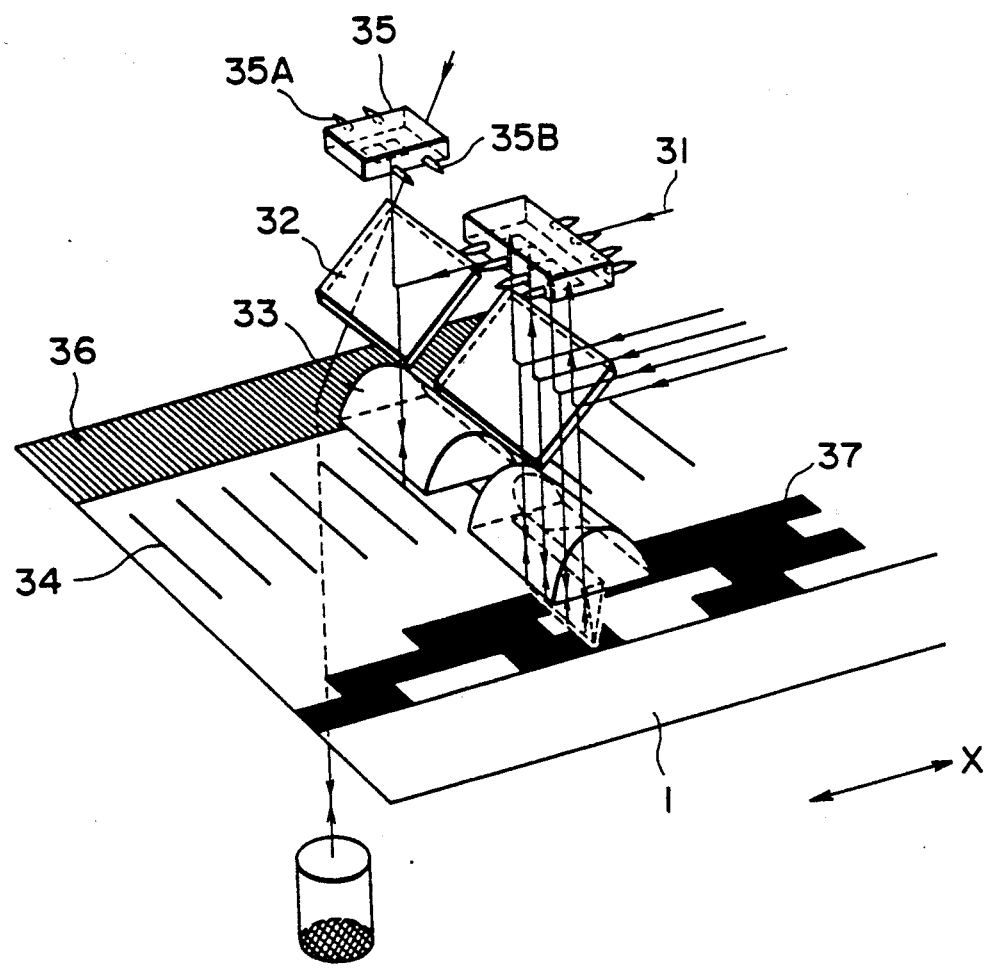
FIGS. 8A to 8C are illustrations of critical portions of modifications of the encoder shown in FIG. 6.
Figure 8B:
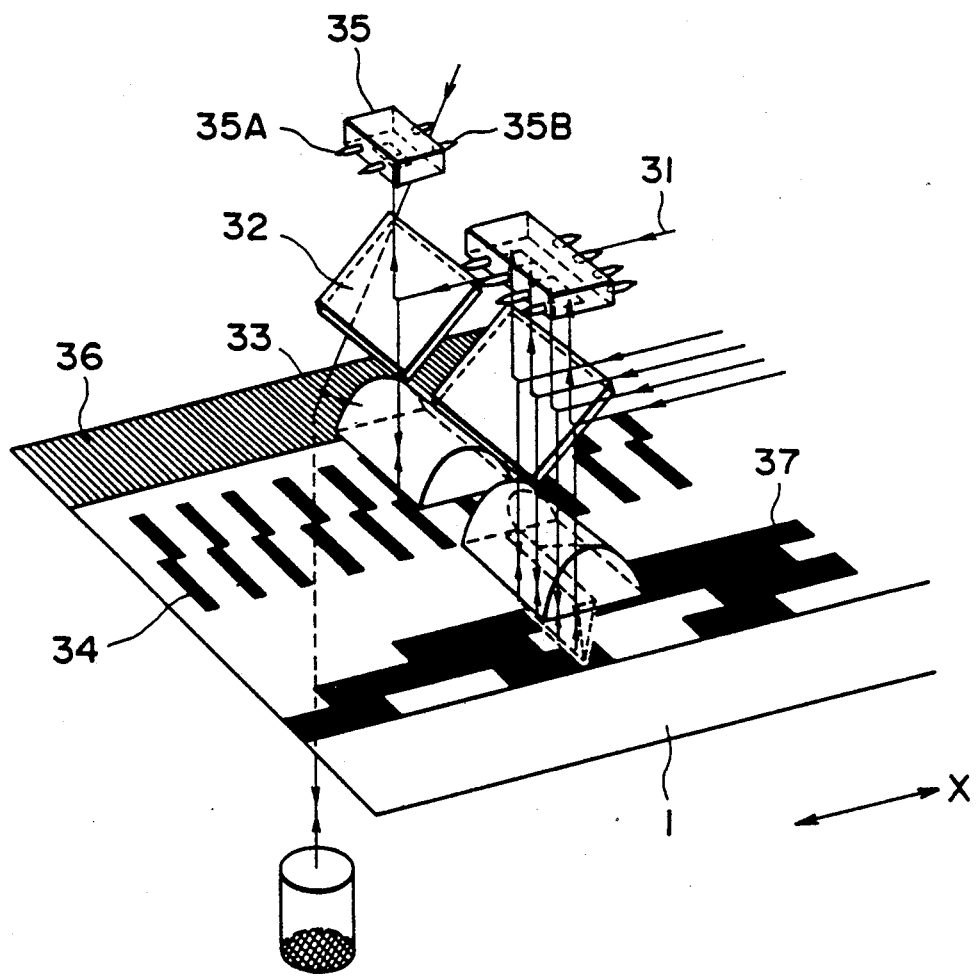
Figure 8C:
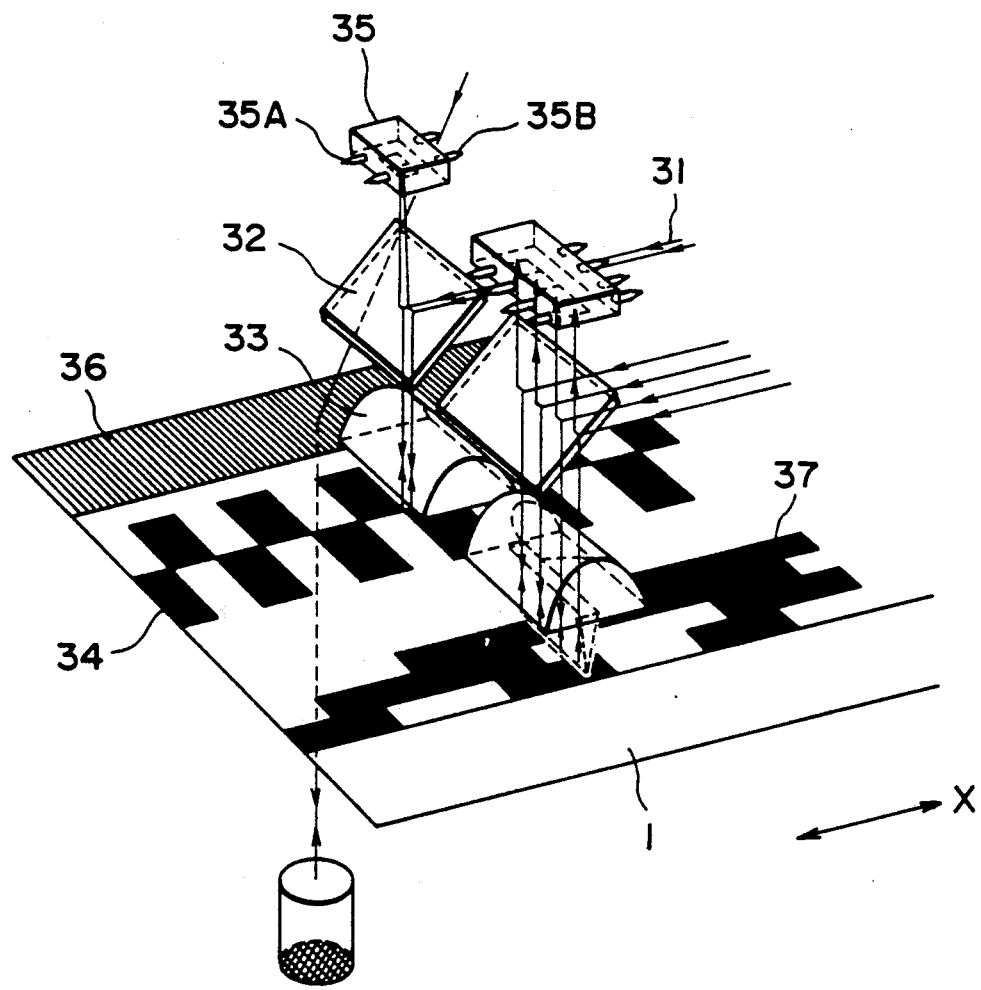

FIGS. 8A, 8B and 8C illustrate examples of the optical system in a linear encoder as an embodiment of the measuring apparatus in accordance with the present invention. In this embodiment, the pattern of the grid portions 34 and 36 are laid unidimensionally in the direction of movement of a linear scale 1. The code portion 37 is composed of a plurality of tracks which extend in the direction of movement indicated by the arrow x, each track carrying translucent and non-translucent portions arranged in predetermined manners. In the arrangement shown in FIG. 8A, the reference position grid portion 34 for obtaining the reference position signal is composed of a plurality of rectangles arranged regularly in the direction of movement and each having a small width. On the other hand, in the arrangement shown in FIG. 8B, the reference position grid portion 34 has pairs staggered rectangles arranged regularly in the direction of movement. In the arrangement shown in FIG. 8C, the reference position grid portion 34 includes rectangles which are arranged in a staggered manner in the direction of movement.

In each of these arrangements, a light beam 31 from a light source (not shown) is reflected by a half mirror 32 and is made to impinge upon the grid portion 34 through the cylindrical lens 33. The light reflected from the grid portion 34 is introduced to a reading device 35 through a cylindrical lens 33 and the half mirror 32. The reading device 35 has, for example, a couple of light-receiving elements 35A and 35B so that it can read the reflected light beam time-sequentially in accordance with the movement of the linear scale 1.

Figure 9A:
FIGS. 9A to 9G are illustration of reference position signals derived from the encoders shown in FIGS. 8A to 8C.

A reference numeral 36 denotes a grid portion for reading the incremental signal, a numeral 34 designates a grid portion for obtaining the reference position signal, and a numeral 37 denotes a code portion for obtaining the absolute signal. In the arrangement shown in FIG. 8A, a string of beam converged to have a width which is about two times as large as the width of the rectangle or line of the grid portion 34 is applied to the grid portion 34 and the light reflected by the grid portion 34 is received by the reading device 35. In consequence, the reading device 35 produces an output as shown in FIG. 9A, in accordance with the movement of the scale 1 in the x direction. More specifically, a difference signal is formed as shown in FIG. B from the outputs of two light-receiving elements 35A and 5B. The difference signal is differentiated to determine the moment at which the levels of the outputs from both light-receiving elements 35A and 35B have become equal to each other and a pulse signal as shown in FIG. 9C is produced at this moment, whereby a reference position signal is obtained by b in FIG. 7 is obtained.

Figure 9B:
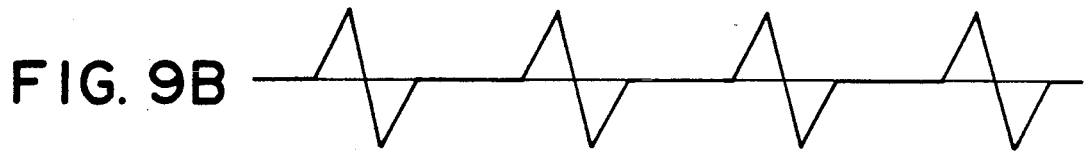
Figure 9C:
Figure 9D:
Figure 9E:
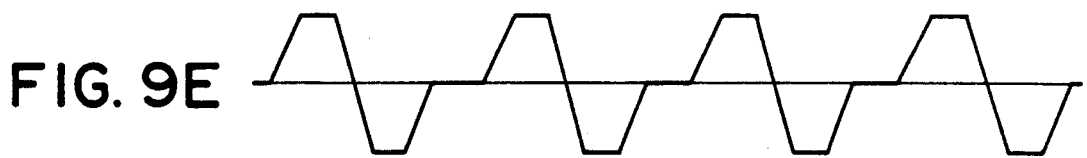
Figure 9F:
Figure 9G:
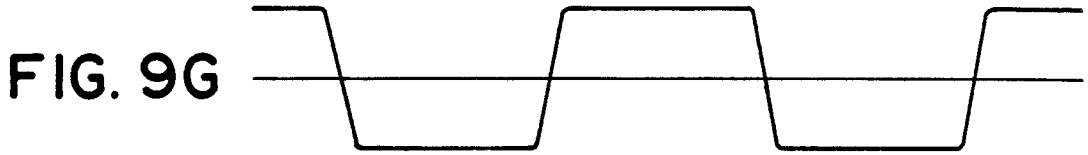

The reading devices 35 in the arrangements shown in FIGS. 8B and 8C produce signals as shown in FIGS. 9D and 9F, respectively. In each of these cases, as in the case of the arrangement shown in FIG. 8A, difference signal obtained from the two output signals from the respective light-receiving elements is differentiated and a pulse signal is generated at the moment at which the levels of two output signals have become equal to each other, whereby a reference position signal is obtained as shown in FIG. 9C.

The method of forming the reference position signal, as well as constructions of the reading device and the reference position grid portion 34, is detailed in the aforementioned specification of the U.S. Pat. application Ser. No. 002,228, so that detailed description thereof is omitted in this specification.

The optical system for obtaining the absolute signal from the code portion 37 in each of the arrangements shown in FIGS. 8A to 8C may be the same as that in the systems shown in FIGS. 2A and 2B.

Figure 10A:
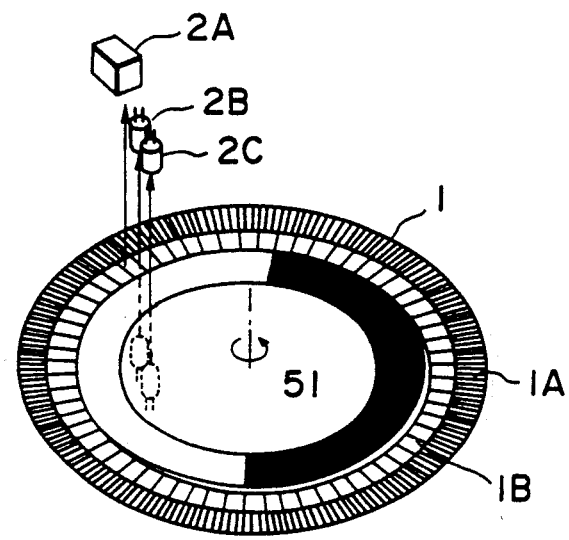
FIGS. 10A to 10B are schematic illustrations of critical portions of further modifications of the encoder shown in FIG. 6.
Figure 10B:
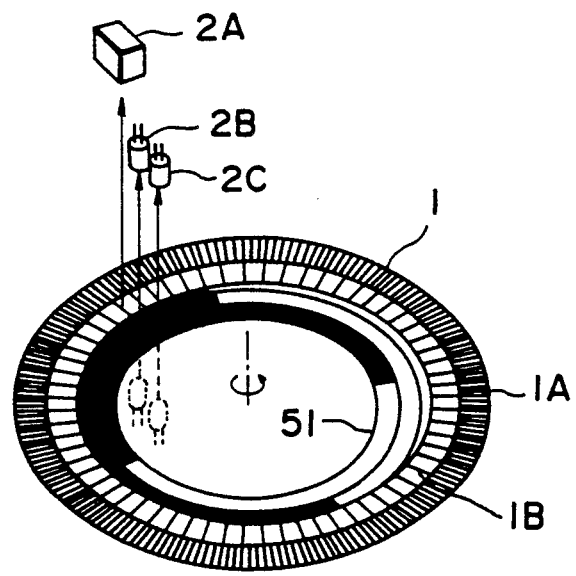

FIGS. 10A and 10B show modifications of the embodiment described above, more specifically different forms of the code portion for producing the absolute signal.

In each of FIGS. 10A and 10B, a code portion 51 for producing the absolute signal has a pattern portion which is adapted to produce a cyclic change in the quantity of the light transmitted through or reflected by this portion 51 with a period which corresponds to one full rotation of the rotating scale 1. Thus, the code portion 51 may be constituted by an ND filter the density of which is progressively changed. More specifically, in the arrangement shown in FIG. 10A, the code portion 51 is composed of a single pattern member, while the code portion 51 in the arrangement shown in FIG. 10B is composed of a pair of pattern members.

Figure 11A:
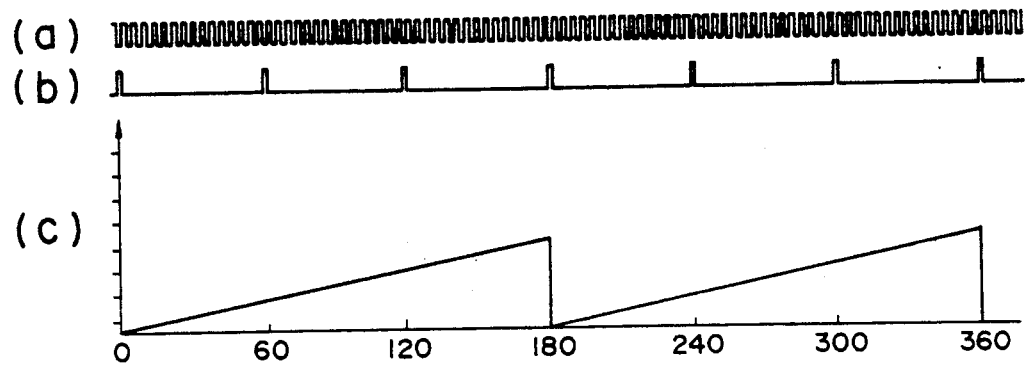
FIGS. 11A and 11B are illustrations of the relationship between an increment signal, a reference position signal and an absolute signal derived from each of the encoders shown in FIGS. 10A and 10B.
Figure 11B:
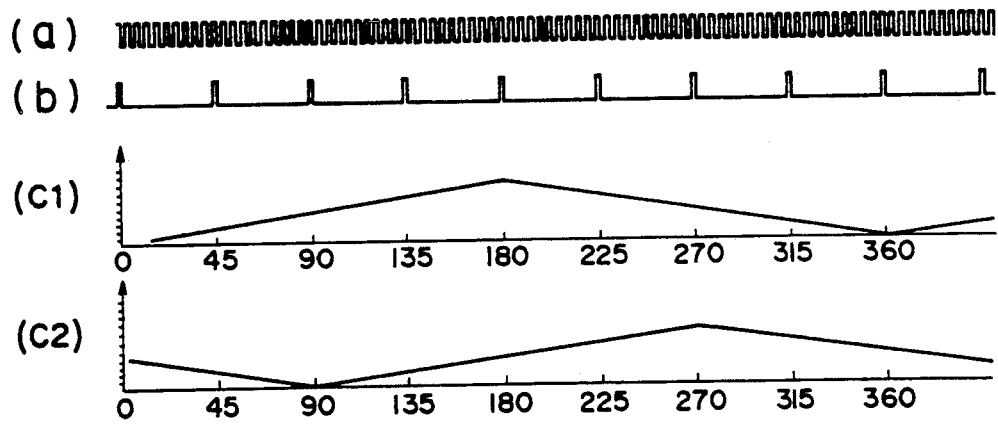

When the rotating scales as shown in FIGS. 10A and 10B respectively are used, the reading devices 2A to 2C produce output signals as shown in FIGS. 11A and 11B. Namely, when the code portion 51 as shown in FIG. 10A is used, the reading devices 2A to 2C respectively produce signals a, b and c shown in FIG. 11A. Signals C1 and C2 in FIG. 11B are obtained when the code portion 51 as shown in FIG. 10B is used. It is possible to attain a higher degree of precision in the detection of the absolute position by suitably combining and processing two output signals C1 and C2.

In the arrangements shown in FIGS. 10A and 10B, the pitch of the grids in the reference position grid portion 1B can be freely selected within such a range which would ensure that the analog absolute signal C or C1, C2 are distinctively separated. Provided that the precision of recording in the reference position grid portion is maintained high, it is possible to obtain a high detecting precision with good reproducibility which well compares with that of the incremental signal.

The illustrated positions of the grid portion, code portion and the reference position grid portion on the scale 1 are only illustrative and may be altered as desired. The signal light beam from each grid portion may be obtained either in the form of reflected light beam or in the form of a transmitted light beam.

A description will be made hereinunder as to two examples of a method for processing the output signal from the rotary encoder shown in FIG. 6 into a signal representing the absolute position of the rotating scale 1.

Figure 12A:
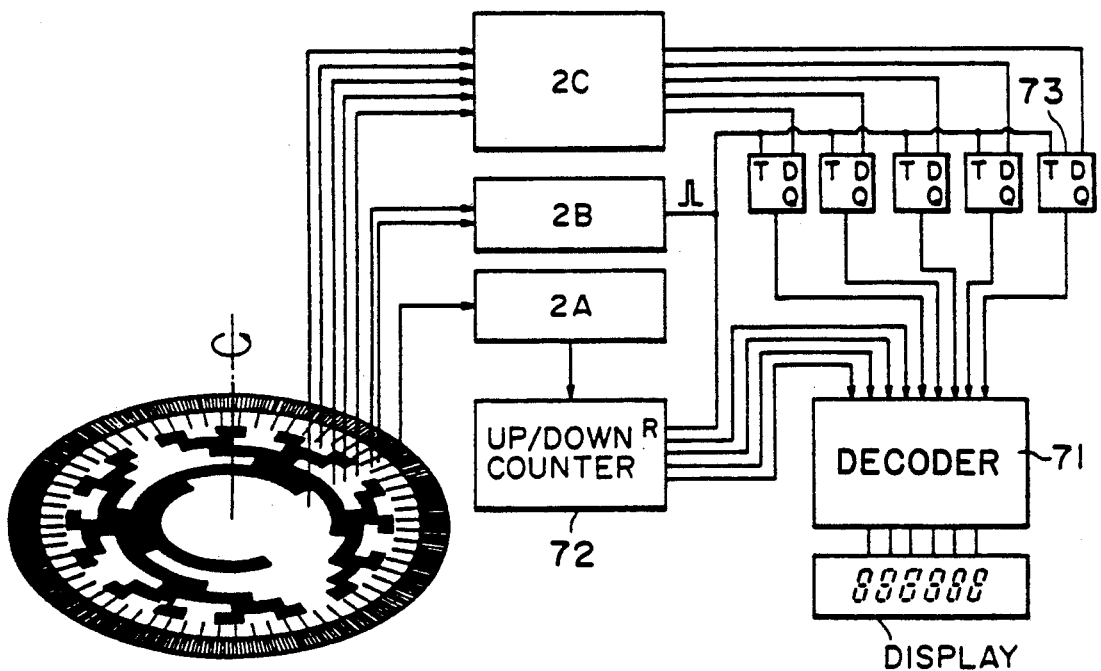
FIGS. 12A and 12B are block diagrams of signal processing circuits for processing signals derived from the encoder shown in FIG. 6.
Figure 12B:
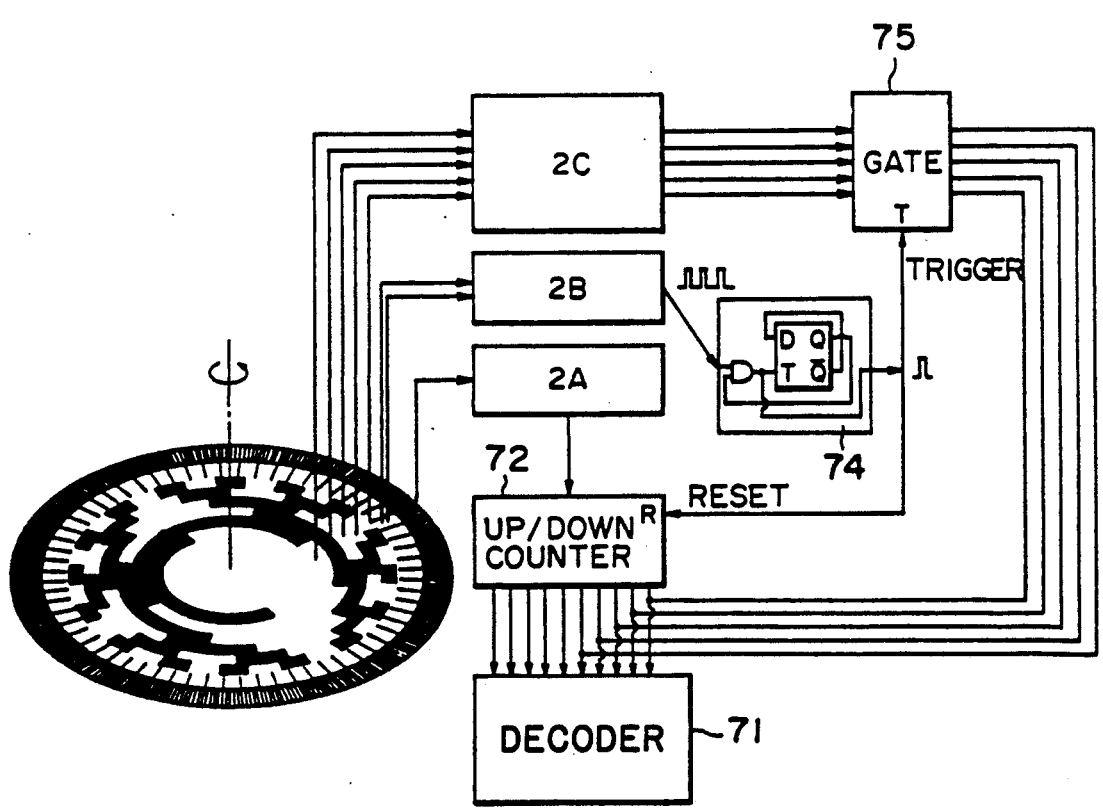

FIGS. 12A and 12B are block diagrams of different examples of a signal processing circuit annexed to the rotary encoder shown in FIG. 6. The circuit has a decoder unit 71, an up/down counter 72, a memory 73, a selective reference signal generating circuit 74 and a gate 75.

The first method will be explained with specific reference to FIG. 12A. In this method, the absolute signal is read each time the reference position signal is generated and is stored in the memory 73 until next reference position signal is received. On the other hand, the counter 72 for counting the incremental signal is cleared each time the reference position signal is generated. The position is roughly detected by the absolute signals and the period between the absolute signals is interpolated by the incremental signals. Since the precision of the timing of switching between successive absolute signals well balances the precision of the incremental signal, it is possible to determine the absolute position with a high degree of resolution by combination between the numerical value represented by the incremental signal and the absolute signal.

The reference position signal is produced by the reading device 2B at a predetermined angular interval during rotation of the scale 1, while the absolute signals are consecutively output from the reading device 2C and the absolute signals available in synchronization with the reference position signals are stored in the group of memories 73. The stored absolute signals are read out without delay and are input to the portions corresponding to the upper digit in the decoder unit 71. The incremental signal is produced periodically by the reading device 2A and is coded and input to the portion of the decoder unit 71 corresponding to lower digit. The counter 72 is adapted to be reset upon receipt of the reference position signal.

The second method will be described with reference to FIG. 12B. The absolute signal concurrent with the first reference position signal is read and stored as the initial value. At the same time, the counter 72 for counting the incremental signal is reset. Thereafter, the reading of the absolute signal and the reset of the counter 72 are not conducted and the data in the decoder unit 71 is renewed solely by the increment of the content of the counter 72. In this method, the initial absolute position is detected by sensing the absolute signal concurrent with the first reference position signal produced after the start-up of the apparatus and the incremental signals are added to or subtracted from the initial value of the absolute position so that an absolute signal is obtained with high degrees of precision and resolution.

The reference position signal is produced by the reading device 2B for each rotation through a predetermined unit angle. The circuit 74 is so designed that it outputs only the first reference position signal but does not produce subsequent reference position signals. On the other hand, the absolute signals are consecutively output by the reading device 2C and only the absolute signal concurrent with the first reference position signal is allowed to pass through the gate 75 so as to be input to the portion of the decoder unit 71 corresponding to upper digits, whereby the setting of the initial value of the absolute position is completed. On the other hand, the incremental signals are produced by the reading device 2A and the period of the incremental signal is measured by the counter 72 and is stored in the portion of the decoder unit 71 corresponding to the lower digits. The counter 72 is adapted to be reset upon receipt of the reference position signal derived from the circuit 74.

The reference position signal used in the arrangements shown in FIGS. 12A and 12B is effectively used in realizing an encoder having a high degree of precision and resolution, by combining an incremental-type encoder having high resolution and an absolute-type encoder of a comparatively low resolution. The reference position signal, however, can be used effectively in attaining an improvement in the detecting precision in a system having an absolute-type encoder alone.

Provided that the grids of the reference position grid portion are formed with a sufficiently high degree of precision, the reference position signal can provide a higher degree of detecting precision than that offered by the changing of the absolute signal.

Thus, each of the encoders explained in connection with FIG. 6 through FIGS. 12A and 12B can read the incremental signal and the absolute signal concurrently from the rotating scale or a linear scale and determine the movement of the object with high degrees of precision and resolution by making use of the read signals. Namely, the absolute position of the object can be determined highly accurately with a high degree of resolution, by detecting the absolute position by the absolute signal which provides a high detecting precision but a comparatively low resolution and then interpolating the period between successive absolute signals with the incremental signals or, alternatively, adding the incremental signals to the absolute signal.

In addition, higher degrees of accuracy and resolution are obtainable by providing means for detecting reference position signal and combining the reference position signal with the above-mentioned two kinds of signals.

In the embodiments described hereinbefore, the information pattern (gray code pattern) constituting the code portion of the rotating scale or the linear scale is illuminated by a string of light beam or a light from a light source array composed of light source elements held on a common member. It is essential that the beam string or the light from the light source array is correctly aligned with the information pattern constituted by, for example, an array of slits. An adjustment is therefore conducted to attain such an alignment.

In general, tracks carrying the binary gray code patterns are so arranged that the track on the inner or outer periphery of a rotating scale produces most significant bit signals, while the track on the outer or inner periphery of the same produces least significant bit signals. When the scale is a linear scale, the track near one side edge of the linear scale produces most significant bit signals, while the track on the opposite end produces least significant bit signals. Thus, the tracks on the inner and outer peripheries or the tracks on both lateral sides are used for the most significant bits and least significant bits.

When the track for the most significant bit signals is formed on the inner periphery of a rotating scale, since this track exhibits comparatively small changes in the bit signals per revolution of the rotating scale, it is extremely difficult to judge whether there is any deviation in the timing of reading of the information with the signals reproduced from this track. If the adjustment of the illuminating light is conducted with these signals, the measuring precision may be impaired seriously.

It is, therefore, preferred to adopt the following bit arrangement, i.e., the gray code, in the code portion for producing the absolute signal.

Figure 13:
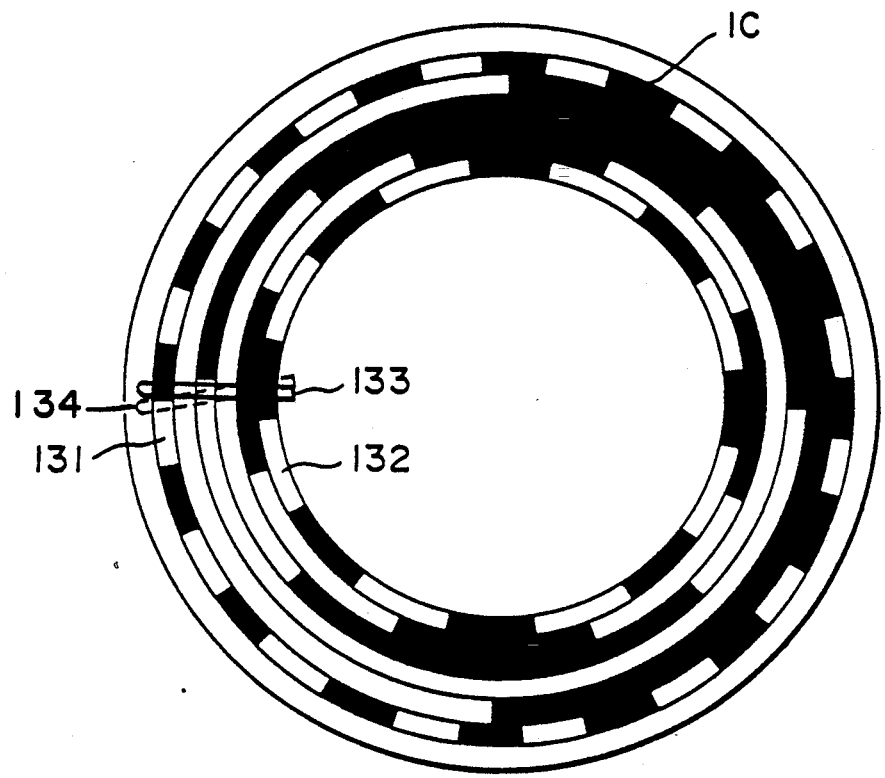
FIG. 13 is a schematic illustration of a preferred form of gray code used in the present invention.

FIG. 13 is a schematic illustration of an example of the most preferred form of gray code suitable for use in the present invention. This figure shows only the portion corresponding to the code portion 1C of the rotating scale 1 of the apparatus shown in FIG. 6.

In this arrangement, the outermost track 131 is used for generation of the least significant bit signals, while the innermost track 132 is used for generating signals of bit which is next to the least significant bit. Thus, the distance between these tracks is maximized and thus the reading error is also maximized. The maximized of the reading error ultimately reduces the overall error by making adjustments easier.

Figure 14A:
FIGS. 14A and 14B are illustrations of a method for bringing a beam string into alignment with a scale carrying the gray code as shown in FIG. 13.
Figure 14B:
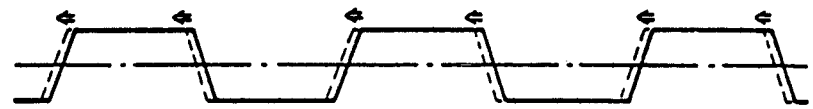

FIGS. 14A and 14B show output signals from the reading device 2C as obtained when the signals on the least significant bit track are read and when the signals on the track for the bit next to the least significant bit are read, respectively.

In FIGS. 14A and 14B, the solid-line curves represent the signals obtained when the light beam string is applied in normal state, i.e., when the beam string is applied such that the direction in which it extends is orthogonal to the direction of rotation of the rotating scale 1, while there is no noise of light beam from the adjacent track. The broken-line curves show the signals obtained when the direction of the beam string is inclined with respect to the correct direction which is orthogonal to the direction of rotation of the code portion 1C. The one-dot-and-dash lines in these figures show a reference level for converting the output signals into binary signal having "1" or "0" level. Namely, the value of the output signal is inverted at a timing at which the signal level crosses this reference level, so as to produce the binary data.

As will be seen from these figures, the deviation of the reading timing with respect to the outermost track for the least significant bit and the deviation of the same with respect to the innermost track for the bit next to the least significant bit take place in opposite directions as indicated by arrows. Thus, the signals reproduced from both tracks exhibit the greatest offsets in both directions.

In this embodiment, therefore, state of incidence of the beam string to the code portion 1C is adjusted such that the above-mentioned offsets are minimized. It will be understood that the offset of the signals with respect to the intermediate other tracks can be maintained below the level of the minimized offsets of signals from the outermost and the innermost tracks, whereby a high accuracy of position detection is ensured.

Obviously, the arrangement shown in FIG. 13 may be modified such that the track 131 for the least significant bit is positioned on the inner periphery of the code portion 1C while the track for the bit which is next to the least significant bit is placed on the outer periphery of the same.

It is also to be understood that this embodiment can be applied to a linear encoder without any modification.

In this embodiment, the track for the least significant bit and the track for the bit next to the least significant bit are arranged such that the distance therebetween is maximized, and the adjustment of the state of incidence of the light to the code portion is effected simply by adjusting the output signals from both tracks. This considerably facilitates the assembly of the apparatus and enables any error in the position of incidence of the light to the object to be reduced.

In consequence, the described embodiment of the invention provides an encoder having high degrees of precision and resolution, in particular an absolute encoder which can operate with a high degree of detecting precision.

We claim:

1. A displacement measuring device, comprising:
   a movable scale for measuring displacement, said scale having a plurality of codes thereon, each code being formed by a plurality of bit patterns arranged in a predetermined direction, said scale also having thereon an incremental pattern having a plurality of diffraction grating patterns arranged with a smaller pitch than the arrangement of the codes, and a reference pattern corresponding to each of the plurality of codes;
   reference signal detecting means including first and second light-receiving elements for detecting the reference pattern by comparing outputs of said first and second light-receiving elements, and generating a reference signal;
   code detecting means for subsequently detecting the codes in response to the reference signal output from said reference signal detecting means;
   incremental signal detecting means for detecting interference light formed by diffracted light from the diffraction grating patterns in response to the displacement of the scale to output an incremental signal;
   counting means for counting the incremental signal output from said incremental signal detecting means, said counting means being reset in response to the reference signal; and
   position detecting means for detecting an absolute position of said scale on the basis of detected codes and the counting of said counting means.

2. A device according to claim 1, further comprising illuminating means for illuminating the codes, and detecting means for detecting light from the codes.

3. A device according to claim 2, wherein said illuminating means illuminates bit patterns of the codes with a light beam having a longitudinal direction set to said predetermined direction of the bit patterns.

4. A device according to claim 3, wherein said illuminating means includes a laser and an anamorphic optical system for converting the laser light from said laser into the light beam.

5. A device according to claim 4, wherein said anamorphic optical system includes a cylindrical lens.

6. A device according to claim 2, wherein said detecting means includes a sensor array for receiving light from a plurality of bit patterns.

7. An encoder for reading out a plurality of codes on a scale, each code being formed by a plurality of bit patterns ranging from a least significant bit to a most significant bit and disposed in a predetermined direction on the scale and arranged such that a least significant bit is not adjacent to a second least significant bit, said encoder further comprising:

illuminating means for illuminating the codes; and a sensor array to read the illuminated codes that comprises a plurality of sensors arranged in a predetermined direction, wherein said sensor array reads the plurality of bit patterns.

8. An encoder according to claim 7, wherein said illuminating means comprises a linear beam for illuminating the codes, having a longitudinal direction set to the predetermined direction of the bit patterns of the codes.

9. An encoder according to claim 8, wherein the least significant bit and the second least significant bit are arranged such that one comprises one bit pattern end portion of the codes and the other comprises another bit pattern end portion of the codes.

10. A method for reading out a plurality of codes formed on a scale along a moving direction of the scale, each of said codes comprising a plurality of bit patterns ranging from a least significant bit to a most significant bit and arranged in a predetermined direction, said method comprising the steps of:

arranging the bit patterns so that the least significant bit is not adjacent to a second least significant bit;

supplying a linear radiation beam;

adjusting the radiation beam by utilizing the least significant bit and the second least significant bit so that the longitudinal direction of the radiation beam is substantially coincident with the predetermined direction of the bit patterns; and subsequently projecting the bit patterns of each of the codes on a sensor array in response to displacement of the scale with the radiation beam after completion of said adjusting step, thereby reading out each of the codes.

11. A method according to claim 10, wherein said arrange step further comprises arranging the least significant bit and the second least significant bit so that one forms a bit pattern end portion of each of the codes and the other forms another bit pattern end portion of each of the codes.

* * * * *

UNITED STATES PATENT AND TRADEMARK OFFICE
CERTIFICATE OF CORRECTION

PATENT NO. : 5,129,725
DATED : July 14, 1992
INVENTOR(S) : Koh Ishizuka, et al.

It is certified that error appears in the above-identified patent and that said Letters Patent is hereby corrected as shown below:

COLUMN 1:

Line 65, "018.536." should read --018,536--.

COLUMN 6:

Line 28, "$20^{10}$" should read --$2^{10}$--.

COLUMN 7:

Line 12, "reflection" should read --reflection film--.
Line 13, "shape" should read --shape or non-translucent film patterns of a predetermined shape--.
Line 60, "diagrammatic are" should read --diagrammatic views of optical systems in which reflection-type encoders are--.
Line 67, "second $f_2$" should read --second focusing lens 12 is selected so that the condition of $f_3 > f_2$--.

COLUMN 8:

Line 20, "lens 8," should read --lens 20,--.

COLUMN 9:

Line 30, "lens 8," should read --lens 20,--.

UNITED STATES PATENT AND TRADEMARK OFFICE
CERTIFICATE OF CORRECTION

PATENT NO. : 5,129,725

DATED : July 14, 1992

INVENTOR(S) : Koh Ishizuka, et al.

It is certified that error appears in the above-identified patent and that said Letters Patent is hereby corrected as shown below:

COLUMN 12:

Line 7, "58" should read --5B--.

COLUMN 14:

Line 32, "posit" should read --position--.

COLUMN 15:

Line 5, "device 28" should read --device 2B--.
Line 62, "358" should read --35B--.

COLUMN 16:

Line 10, "Fig. B" should read --Fig. 9B--.
Line 11, "5B." should read --35B.--.
Line 42, "108," should read --10B,--.

COLUMN 17:

Line 55, "Fig. 128." should read --Fig. 12B.--.

COLUMN 19:

Line 29, "maximized" should read --maximization--.

UNITED STATES PATENT AND TRADEMARK OFFICE
CERTIFICATE OF CORRECTION

PATENT NO. : 5,129,725

DATED : July 14, 1992

INVENTOR(S) : Koh Ishizuka, et al.

It is certified that error appears in the above-identified patent and that said Letters Patent is hereby corrected as shown below:

COLUMN 22:

Line 21, "arrange" should read --arranging--.

Signed and Sealed this

Nineteenth Day of October, 1993

Attest:

BRUCE LEHMAN

Attesting Officer

Commissioner of Patents and Trademarks